United States Patent [19]

Ryu

[11] Patent Number: 4,647,903
[45] Date of Patent: Mar. 3, 1987

[54] SUCCESSIVE APPROXIMATION ANALOG-TO-DIGITAL CONVERTER

[75] Inventor: Kazuo Ryu, Tokyo, Japan

[73] Assignee: NEC Corporation, Tokyo, Japan

[21] Appl. No.: 586,960

[22] Filed: Mar. 7, 1984

[30] Foreign Application Priority Data

Mar. 7, 1983 [JP] Japan .................................. 58-36956

[51] Int. Cl.$^4$ ............................................. H03M 1/46
[52] U.S. Cl. ....................... 340/347 AD; 340/347 DA
[58] Field of Search .................. 340/347 AD, 347 DA

[56] References Cited

U.S. PATENT DOCUMENTS 3,183,360  5/1965  Van Santen ................. 340/347 AD
4,198,622  4/1980  Connolly ..................... 340/347 AD

*Primary Examiner*—Charles D. Miller
*Attorney, Agent, or Firm*—Sughrue, Mion, Zinn, Macpeak & Seas

[57] ABSTRACT

In order to reduce the numbers of resistors and associated switches required in a successive approximation type a-d converter, a resistor-ladder of the d-a converter utilizes a first group of resistors (resistance R) and a second group of resistors each having a resistance equal to $R/2^L$ wherein L is the number of lower bits of the digital output. The second group of resistors enables the generation of variable comparison reference signals in response to the output of a successive approximation register.

8 Claims, 7 Drawing Figures

SUCCESSIVE APPROXIMATION ANALOG-TO-DIGITAL CONVERTER

BACKGROUND OF THE INVENTION

1. Field of the Invention

The present invention relates to a successive approximation analog-to-digital (a-d) converter, and more specifically to such a kind of monolithic type of a-d converter including an improved digital-to-analog (d-a) converter, which a-d converter is manufactured by C-MOS (Complementary-Metal-Oxide-Semiconductor) techniques.

2. Description of the Prior Art

Various attempts have been made to develop a-d converters using MOS techniques. One of such a-d converter is disclosed in U.S. Pat. No. 4,293,848 (corresponding to Japanese Patent Application No. 54-46461).

This prior art teaches an a-d converter operable with a single power supply and featuring conversion of an analog input signal up to a potential equal to that of the power supply using only one bootstrap circuit. This prior art however encounters the drawbacks that: (a) voltage dividing errors tend to occur which increase gain errors, since an analog input signal is capacitively voltage divided into two, and since one half of a reference voltage (Vref) is obtained by a resistor-ladder network including a considerable number of resistors ($2 \times 2^N$) (wherein "N" denotes the bits of a digital output), and (b) the large number of resistors used occupies an undesirable amount of chip area inducing increased manufacturing cost.

Another 8-bit a-d converter using C-MOS techniques is disclosed on pages 131-135 of "Electronics" (Apr. 27, 1978). This second prior art arrangement includes a d-a converter including 256 (viz., $2^8$) resistors connected in series and 510 switches for deriving voltages at the nodes of these resistors. This second prior art is similarly plagued by the large number of resistors as well as switches. In general this type of N-bit a-d converters, require $2^N$ resistors and ($2^{N+1}-1$) switches, and hence consume a large amount of chip space, induce high manufacturing cost, and low production rate due to the large number of circuit elements. Further, these arrangements encounter the problem that the conversion speed is limited due to on-resistance of N switches coupled in series between each resistor node and a comparator.

SUMMARY OF THE INVENTION

The first object of the present invention is therefore to provide an a-d converter which is free from the aforementioned problems inherent in the prior arts.

The another object of the present invention is to provide an a-d converter which is provided with a sample-and-hold function and which features conversion of an analog input signal up to the power supply potential, into the digital equivalent.

The still another object of the present invention is to provide an a-d converter which occupies only a small chip area and which is capable of implementing an analog-to-digital conversion with high accuracy.

The still further object of the present invention is to provide an a-d converter which is suitable for monolithic circuitry using C-MOS techniques.

The still further object of the present invention is to provide an a-d converter including an improved d-a converter by which a considerable reduction in the number of resistors and switches required to construct an a-d converter is attained.

More specifically, the present invention takes a form of a successive approximation analog-to-digital converter adapted to receive an analog input signal for converting same into a N-bit digital signal (N is a positive integer), comprising: a digital-to-analog converter; a first switch means supplied with the analog input signal and the output of the digital-to-analog converter, the first switch means being arranged to selectively allow one of the two received signals to pass therethrough; a comparator for receiving the analog input signal via the first switch means; a successive approximation register for receiving the output of the comparator; the digital-to-analog converter including first and second means both of which are controlled by the output of the successive approximation register, the first means selectively applying one of a plurality of comparison reference voltages to the comparator, and the second means selectively applying the output of the digital-to-analog converter to the comparator via the first switch means.

Further, the present invention takes another form of a digital-to-analog converter adapted to convert a digital input signal (N bits) to the analog equivalent, comprising: ($2^U - 1$) first resistors each of which has identical resistance (R) and which consists of first and second resistor-ladders ("U" denotes predetermined upper bits of "N"); first switch means for selectively deriving one of the voltages appearing at the nodes of the first resistors; first switch control means for controlling the first switch means in response to the digital input signal; a third resistor-ladder consisting of $2^L$ second resistors each of which has a resistance equal to $R/2^L$ and which are coupled in series with the first and second resistor-ladders to form a fourth resistor-ladder ($L = N - U$), the fourth resistor-ladder being supplied with a reference voltage thereacross; second switch means for selectively deriving one of the voltages appearing at the nodes of the second resistors; and second switch control means for controlling the second switch means in response to the digital input signal.

BRIEF DESCRIPTION OF THE DRAWINGS

The features and advantages of the present invention will become more clearly appreciated from the following description taken in conjunction with the accompanying drawings in which like blocks, circuits and circuit elements are denoted by like reference numerals and in which.

DETAILED DESCRIPTION OF THE PREFERRED EMBODIMENTS

Figure 1:
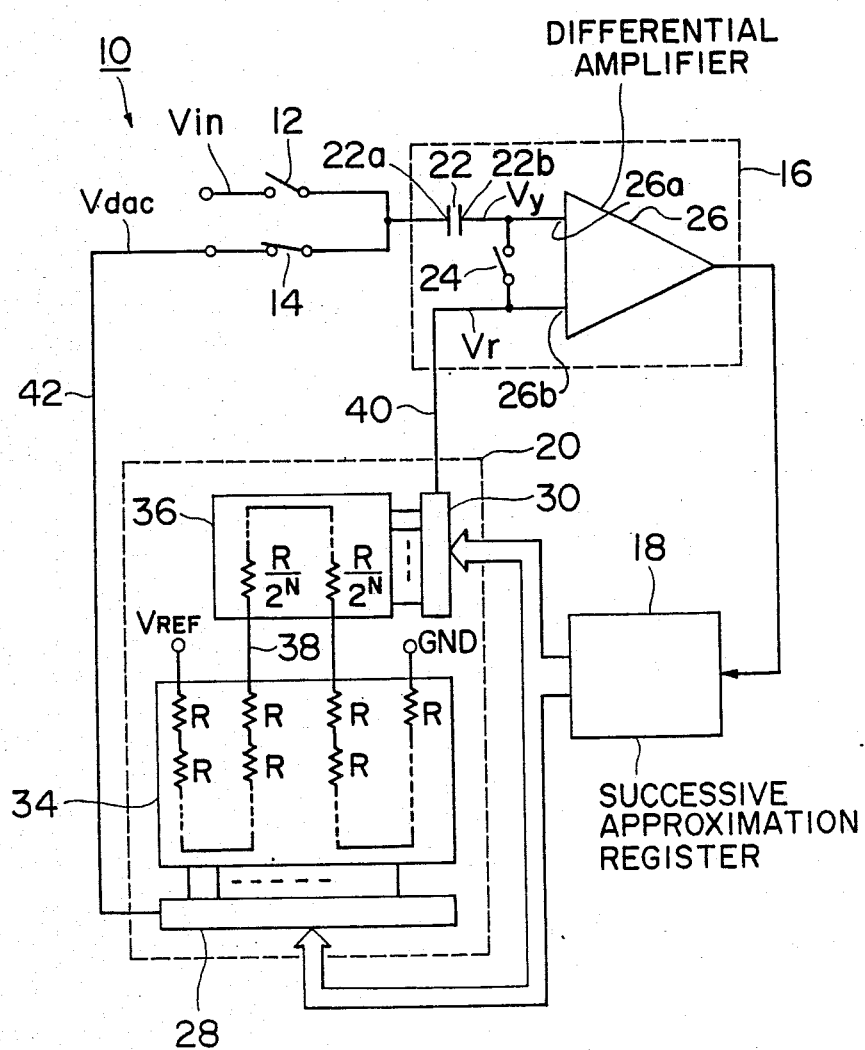
FIG. 1 is a block diagram showing a first embodiment of the a-d converter according to the present invention.

Referring now to FIG. 1, there is shown in block diagram form a first embodiment of an a-d converter 10 according to the present invention. The a-d converter 10 generally comprises switches 12 and 14, a comparator 16, a successive approximation register 18, and a d-a converter 20, all of which are coupled as shown.

The comparator 16 includes a capacitor 22, a switch 24 and a differential amplifier 26. On the other hand, the d-a converter 20 includes two switch controllers 28 and 30, two resistance sections 34 and 36, and a plurality of switches (not shown in FIG. 1) which are arranged between the switch controllers 28, 30, and the resistor sections 34, 36. Resistors R and R' (FIG. 2) of the respective resistor sections 34 and 36 are connected in series to form a resistor-ladder network 38, which is coupled at one end to a reference voltage (VREF) supply and at the other end to ground. It should be noted that the reference character "R" depicts a resistor as well as the resistance thereof on a case-by-case basis. The total series-resistance of the resistors R' is equal to R. The number of the resistors R' is determined by $2^L$, and the resistance thereof by $R/2^L$, wherein "L" denotes the predetermined number of lower bits of a digital output of the a-d converter 10 (or a digital input of the d-a converter 20).

Assuming first that the switches 12, 24 are closed, and that the switch 14 is open it will be seen that an analog signal Vin is applied to one terminal 22a of the capacitor 22 via the switch 12, while a comparison reference voltage Vr is supplied from the d-a converter 20 to the other terminal 22b of the capacitor 22 via the line 40 and the switch 24. Consequently, the capacitor 22 develops charges Q1 which are given by the following equation (1):

$$Q1 = C(Vr - Vin) \qquad (1)$$

wherein C denotes the capacitance of the capacitor 22. Conversely, opening of the switches 12 and 24 and the closing of the switch 14, allows an analog signal Vdac from the d-a converter 20 to be applied, via a line 42 and the switch 14, to the terminal 22a of the capacitor 22. Therefore, the capacitor 22 develops charges Q2 which are given by the following equation (2):

$$Q2 = C(Vy - Vdac) \qquad (2)$$

wherein Vy depicts the voltage at the terminal 22b of the capacitor 22. Since Q1 is equal to Q2, the following equation (3) may be derived:

$$C(Vr - Vin) = C(Vy - Vdac) \quad Vy = (Vdac - Vin) + Vr \qquad (3)$$

The differential amplifier 26 is supplied with the voltages Vy, Vr at the inputs 26a, 26b respectively, and thence applies the output thereof to the successive approximation register 18. The register 18 determines if the most significant bit (MSB) is a logic 1 or 0 according to the output of the differential amplifier 26, and stores the determined logic signal in a logic cell provided therein for the MSB. Thereafter, the successive approximation register 18 responds to the logic value of the MSB, and applies control signals to the switch controller 28 which controls the voltage Vdac for the following approximation. It should be noted that (a) the comparison reference voltage Vr is maintained constant until the completion of the upper "U" determinations wherein $U = N - L$ (wherein "N" is the number of the output bits of the a-d converter 10), and (b) the switches 12 and 24 remain open while the switch 14 is kept closed until the end of the successive approximation of an analog input signal applied. Further discussions of the present invention will be given with reference to FIG. 2.

Figure 2:
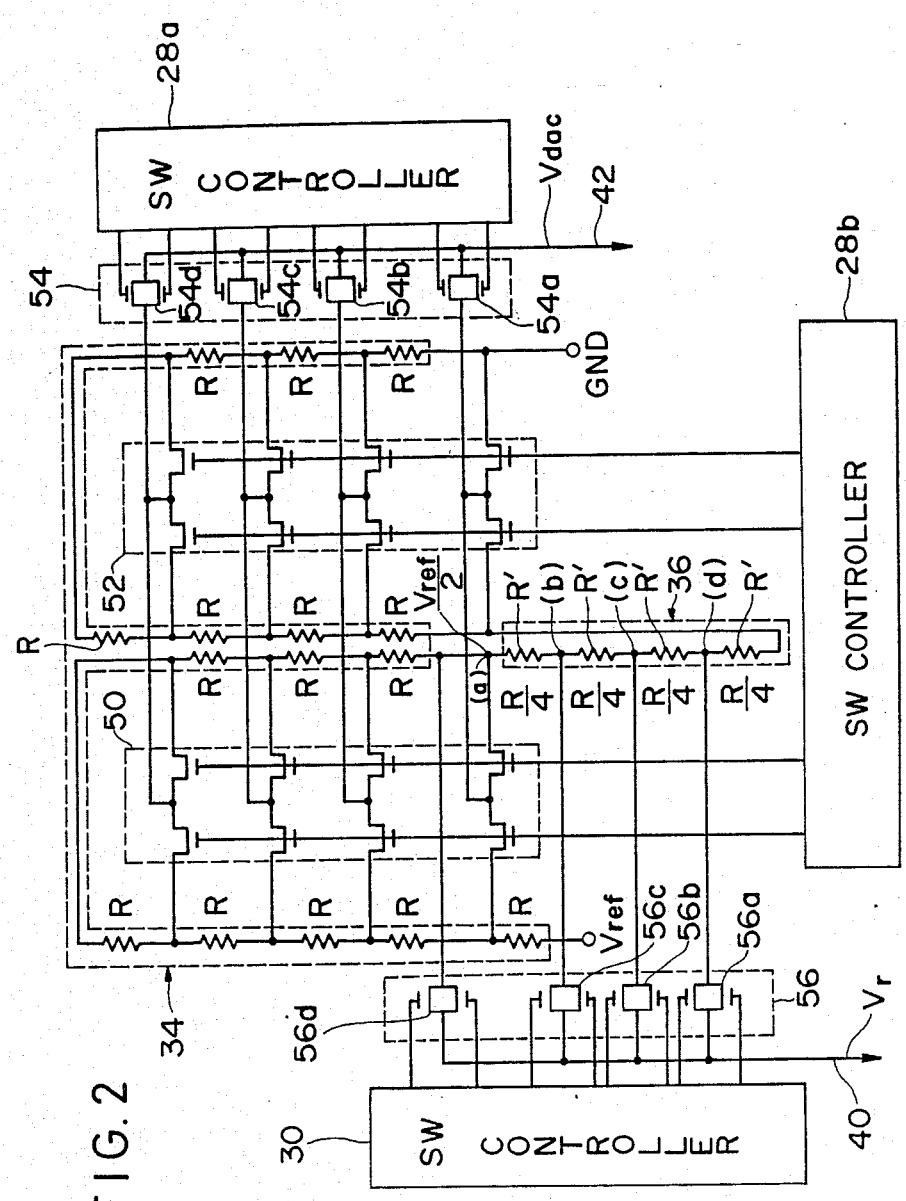
FIG. 2 is a circuit arrangement showing in detail part of the FIG. 1 block diagram.

FIG. 2 is a circuit arrangement showing in detail one of the embodiments of the d-a converter 20, whose digital input is formed of 6 bits for simplicity but not limited to same. The 6 bits of the digital input are, in this case, classified into the upper 4 bits (U=4) and the lower 2 bits (L=2).

The d-a converter 20 shown in FIG. 2 comprises 15 resistors R in the resistor section 34, 4 resistors R' in the resistor section 36, four switch groups 50, 52, 54 and 56, two switch controllers 28a and 28b (corresponding to the single element 28 of FIG. 1), and another switch controller 30. The total series-resistance of the 4 resistors R' is equal to that of the one resistor R as mentioned previously. The switches involved in the switch groups 50 and 52 are respectively by P- and N-channel C-MOS transistors, while each of the switches (54a–54d, 56a–56d) in the switch groups 54 and 56 consists of P- and N-channel C-MOS transistors coupled in parallel.

Hereinlater, the operation of the a-d converter 10 will be explained in detail with reference to FIGS. 1 and 2. Once the analog input Vin is sampled and applied via the switch 12 and then is stored in the capacitor 22, the switches 12 and 24 are closed while the switch 14 is open. As referred to supra, the comparison reference voltage Vr is maintained constant (=Vref/2) until all the upper 4 bits are determined. In order to first determine the MSB, the switch controller 30 applies a control signal to the switch 56d for opening same. Consequently, the voltage Vref/2 at a point (a) is derived as the comparison reference voltage Vr and thence applied to the input terminal 26b of the differential amplifier 26 over the line 40. Further, the switch controller 28a allows the switch 54a to be open, while the controller 28b allows a switch 50 to be open, whereby the voltage Vref/2 is supplied to the terminal 22a of the capacitor 22 as Vdac. In the case where the incoming analog signal Vin exceeds Vref/2, the register 18 stores therein a logic 1 in an MSB bit position in response to the output of the amplifier 26, and thence applies control signals to the switch controllers 28a and 28b in order that the d-a converter 20 outputs a voltage ¾Vref (Vdac) via the line 42.

On the other hand, if Vin does not exceed Vref/2, the register 18 responds to the output of the amplifier 26 and stores therein a logic 0 in the MSB bit position, and thence applies control signals to the switch controllers 28a and 28b to induce the d-a converter 20 to output a voltage ¼Vref (Vdac) via the line 42. Similarly, the remaining 3 upper bits are successively approximated. The voltage variations of Vy can conveniently be expressed by the following equation (4):

$$Vy = \{Vref/2^6(D_1 2^5 + D_2 2^4 + D_3 2^3 + D_4 2^2) - Vin\} + Vref/2 \qquad (4)$$

Wherein $D_1$, $D_2$, $D_3$ and $D_4$ denote logic values (1 or 0) of the MSB, the second, third and fourth MSB bits, respectively. It should be noted that $D_2$, $D_3$ and $D_4$ assume a value of "0" if the corresponding bits are not yet determined.

Prior to the determination of the fifth bit (viz., the first lower bit), the switch controller 30 closes the switch 56d and opens the switch 56b for changing Vr from Vref/2 to (Vref/2−Vref/2$^5$). Thereafter, logic values (viz., "1" or "0") of the first lower bit is determined. The difference of the voltages applied to the differential ampifier 26, viz. (Vy−Vr) is represented by:

$$Vy - Vr = \{Vref/2^6(D_1 2^5 + D_2 2^4 + D_3 2^3 + D_4 2^2) - \quad (5)$$
$$Vin + Vref/2\} - (Vref/2 - Vref/2^5) =$$
$$Vref/2^6(D_1 2^5 + D_2 2^4 + D_3 2^3 + D_4 2^2) - Vref/2^5 - Vin =$$
$$Vref/2^6(D_1 2^5 + D_2 2^4 + D_3 2^3 + D_4 2^2 + D_5 2^1) - Vin$$

wherein $D_5$ denotes the logic value of the fifth bit.

Lastly, the logic value of the LSB (Least Significant Bit) is determined. In the case where the fifth bit was "0", the switches 56b and 56c are respectively open and closed for producing a value of (Vref/2−Vref/2$^6$) as Vr, wherein the voltage difference (Vy−Vr) is:

$$Vy - Vr = \{Vref/2^6(D_1 2^5 + D_2 2^4 + D_3 2^3 + D_4 2^2) - \quad (6)$$
$$Vin + Vref/2\} - (Vref/2 - Vref/2^6) =$$
$$Vref/2^6(D_1 2^5 + D_2 2^4 + D_3 2^3 + D_4 2^2 + D_6 2^0) - Vin$$

Thereafter, the sixth bit (LSB) is determined.

Whilst, if the fifth bit was "1", then the switches 56b and 56a are respectively closed and open for producing a voltage (Vref/2–3Vref/2$^6$) as Vr, wherein the voltage difference (Vy−Vr) is:

$$Vy - Vr = \{Vref/2^6(D_1 2^5 + D_2 2^4 + D_3 2^3 + D_4 2^2) - \quad (7)$$
$$Vin + Vref/2\} - (Vref/2 - 3Vref/2^6) =$$
$$\{Vref/2^6(D_1 2^5 + D_2 2^4 + D_3 2^3 + D_4 2^2) - Vin + Vref/2\} -$$
$$\{Vref/2 - (Vref/2^5 + Vref/2^6)\} =$$
$$Vref/2^6(D_1 2^5 + D_2 2^4 + D_3 2^3 + D_4 2^2 + D_5 2^1 + D_6 2^0) - Vin$$

Thereafter, the sixth bit (LSB) is determined. In the FIG. 2 arrangement, the digital-to-analog converter 20 includes two converting sections, termed first and second digital-to-analog converters. The first digital-to-analog converter includes the switch controllers 28a, 28b, switch groups 50, 52, 54, and the resistor section 34. On the other hand, the second digital-to-analog converter includes the switch controller 30, the switch group 56, and the resistor section 36.

Figure 3:
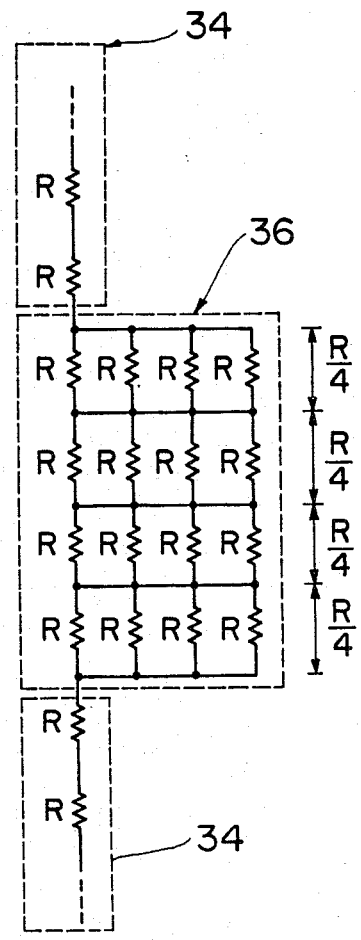
FIG. 3 is a resistor network showing one example of part of the arrangement shown in FIGS. 1 and 2.

FIG. 3 shows an example of the resistor network of the resistor section 36. As shown, the resistance (R/4) of each resistance R' is obtained by connecting 4 resistors R in parallel. This arrangement has been found to be the most practical in terms of matching the resistor section 36 with the other resistor section 34.

As will be readily appreciated from the foregoing the present invention enables a remarkable reduction in the number of resistors and switches required to construct an a-d converter, as compared with the aforementioned prior arts.

More specifically, the number of the resistors of section 34 is ($2^U-1$), while the number of the resistors of section 36 is $2^{2L}$ in the case where these resistors are arranged as shown in FIG. 3. The resistors provided in the d-a converter 20 therefore total ($2^U+2^{2L}-1$). As to the switches, there are provided (a) 2U switches in the two switch groups 50 and 52, (b) $2^{U/2}$ switches to be controlled by the switch controller 28a, and (3) $2^L$ switches to be controlled by the switch controller 28b. Therefore, the total number of the switches employed is ($2^U+2^{U/2}+2^L$).

In comparison, the first prior art requires resistors totalling $2^N$ ($N=U+L$), switches upwards of $2^N$, and additionally dummy resistors totalling $2^N$. While, the second prior art necessitates resistors totalling $2^N$ and ($2^{N+1}-2$) switches.

Considering a 10-bit a-d converter by way of example, the first prior art requires up to 2×1024 resistors and switches upwards of same. Whilst, according to the present invention, the resistors and switches used in the d-a converter 20 number only 271 and 276 respectively (in the case of U=8, L=2). Consequently, the a-d converter of the present invention requires less chip space with attendant advantages of an increased number of chips which can be manufactured at one time, a higher production rate, and notable cost reduction.

In addition, according to the present invention, the switches of the switch groups 50, 52, 54 and 56 are constructed using a C-MOS technique and thus can be operated by voltages lower than the power supply. As a result, the a-d converter of the present invention dispenses with the bootstrap circuit required by the first prior art, and hence saves the ralatively large space consumed by same. This increases further reduction in size of the a-d converter of the present invention.

Figure 4:
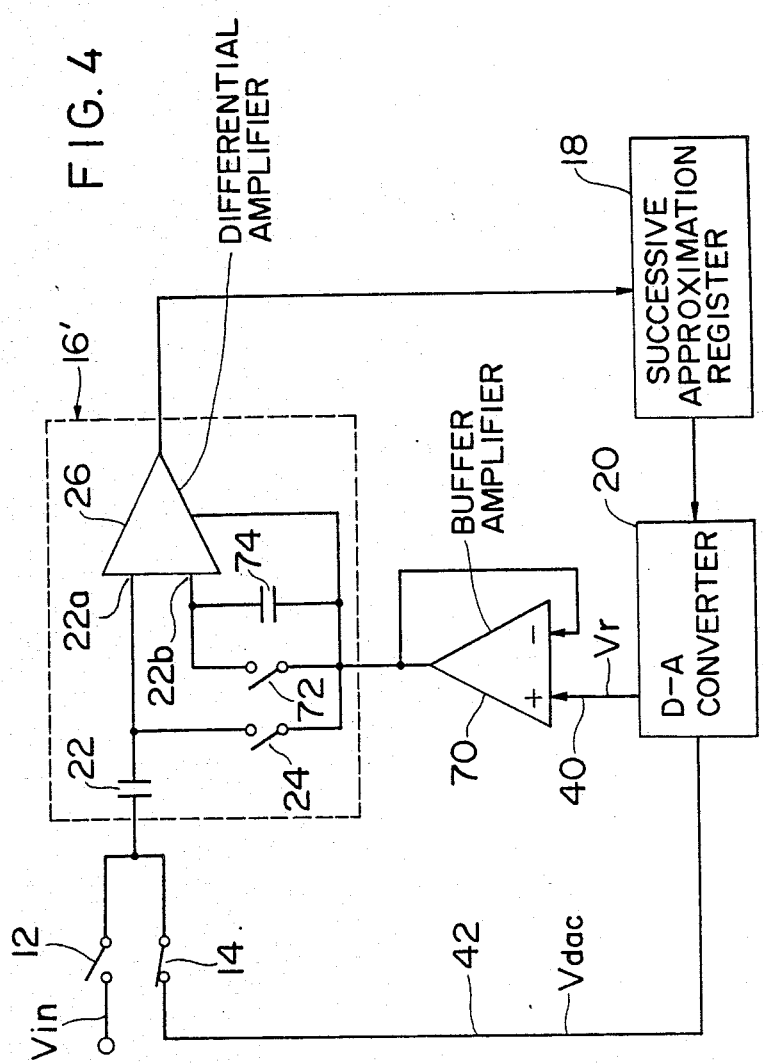
FIG. 4 is a block diagram showing a second embodiment of the a-d converter according to the present invention.

FIG. 4 is a block diagram showing a second embodiment of the present invention. The FIG. 4 circuit arrangement is the same as the FIG. 1 circuit arrangement except that (a) a buffer amplifier is added, and (b) a comparator 16' is further provided with a switch 72 and a capacitor 74.

The buffer amplifier 70 is a voltage follower with a gain 1, and is effective in the case where the impedance of the d-a converter 20 looking from the line 40 is relatively high. Otherwise this element could be omitted as in the first embodiment shown in FIG. 1. The switch 72 and the capacitor 74 are substantially identical to the switch 24 and the capacitor 20, respectively, and are provided to compensate for a so-called "step error" due to the on-and-off operations of the switch 24, or due to leakage of the charges stored in the capacitor 20. The switch 72 and the capacitor 74 need not to be provided if the capacitor 20 has such a sufficiently large capacitance that the "step-error" is small to a negligible extent.

Figure 5:
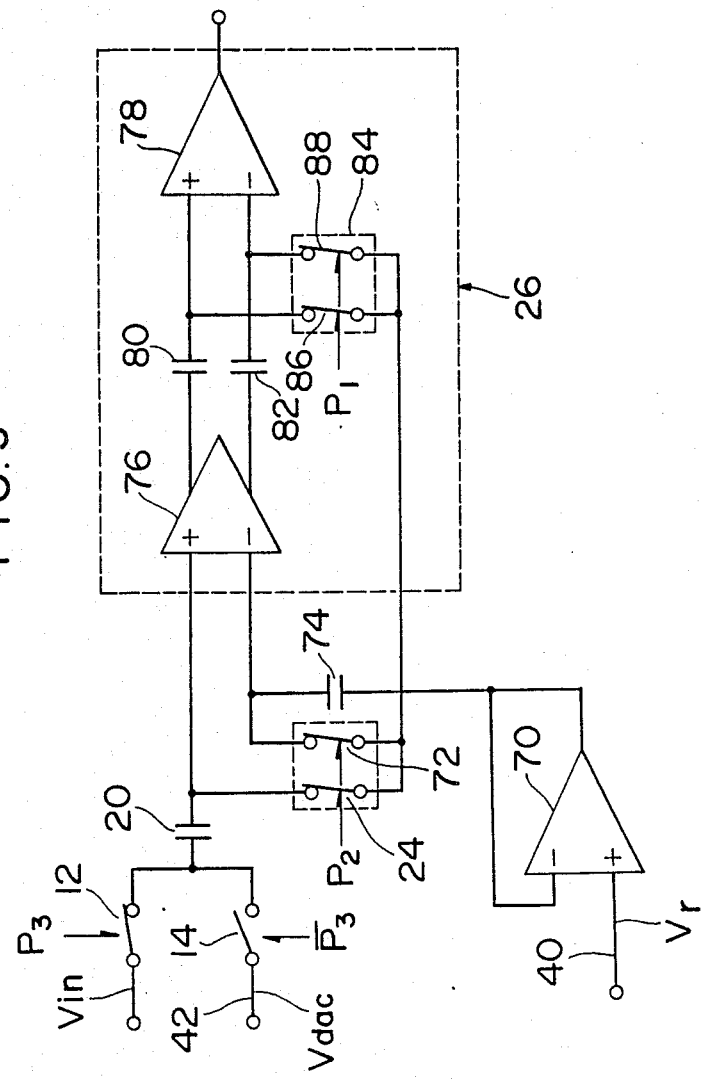
FIG. 5 is a block diagram showing in detail of part of the circuitry shown in FIG. 4.
Figure 6:
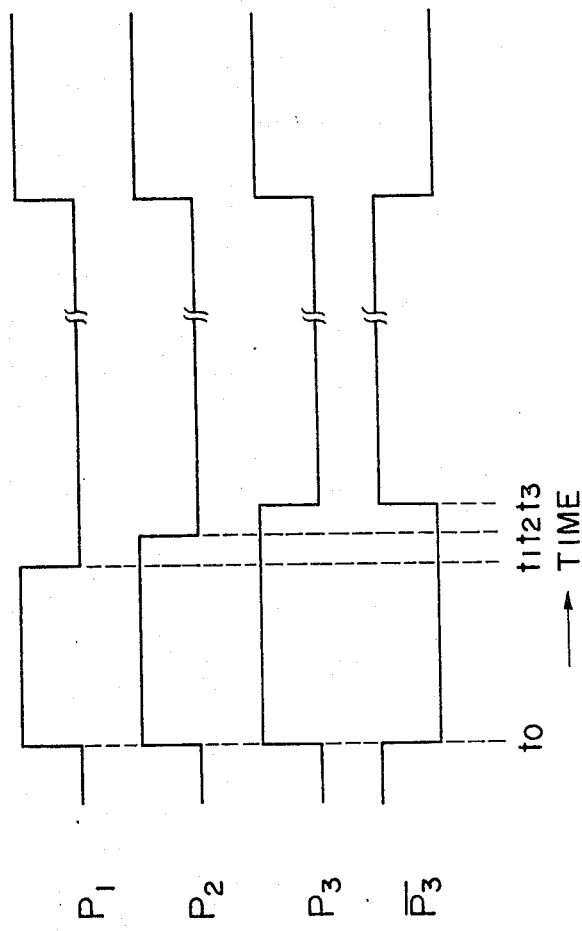
FIG. 6 is a time chart showing on-and-off timings of the switches shown in FIG. 5.

FIG. 5 is a block diagram showing in detail of the differential amplifier 26 together with the associated circuit elements, for further discussion of the the step error compensations with reference to the timing charts shown in FIG. 6.

The differential amplifier 26 shown in FIG. 5 comprises two differential amplifiers 76 and 78, two capacitors 80 and 82 placed between the amplifiers 76 and 78, and switch means 84 consisting of two switches 86 and 88. At a time point $t_0$, a switch control signal $P_3$ opens the switch 14, while another switch control signals $P_1$, $P_2$ and $P_3$ close the switches 12, 24, 72, 86 and 88, thereby allowing the analog input signal Vin to be sampled. At a time point $t_1$, the control signal $P_1$ opens the switches 86 and 88, and hence allows the input offset voltage of the differential amplifier 26 to be held in the capacitors 80 and 82. At a time point $t_2$, the switches 24 and 72 are rendered to be open so that the analog input signal Vin is held in the capacitor 20. Subsequently, at a time point $t_3$, the switches 12 and 14 are open and closed respectively by the control signal $P_3$ and $\overline{P_3}$, after which Vin are successively approximated. These successively delayed openings of the switches 12, 24, 72, 86 and 88 enable the prevention of the leakage of charges stored in the capacitors 80, 82 and 20, and hence are capable of minimizing the step errors. Further, these switching operations enable the comparisons to be implemented with high accuracy in that the input offset voltage of the differential amplifier 26 is held in the capacitors 80 and 82 prior to the comparing operations.

Figure 7:
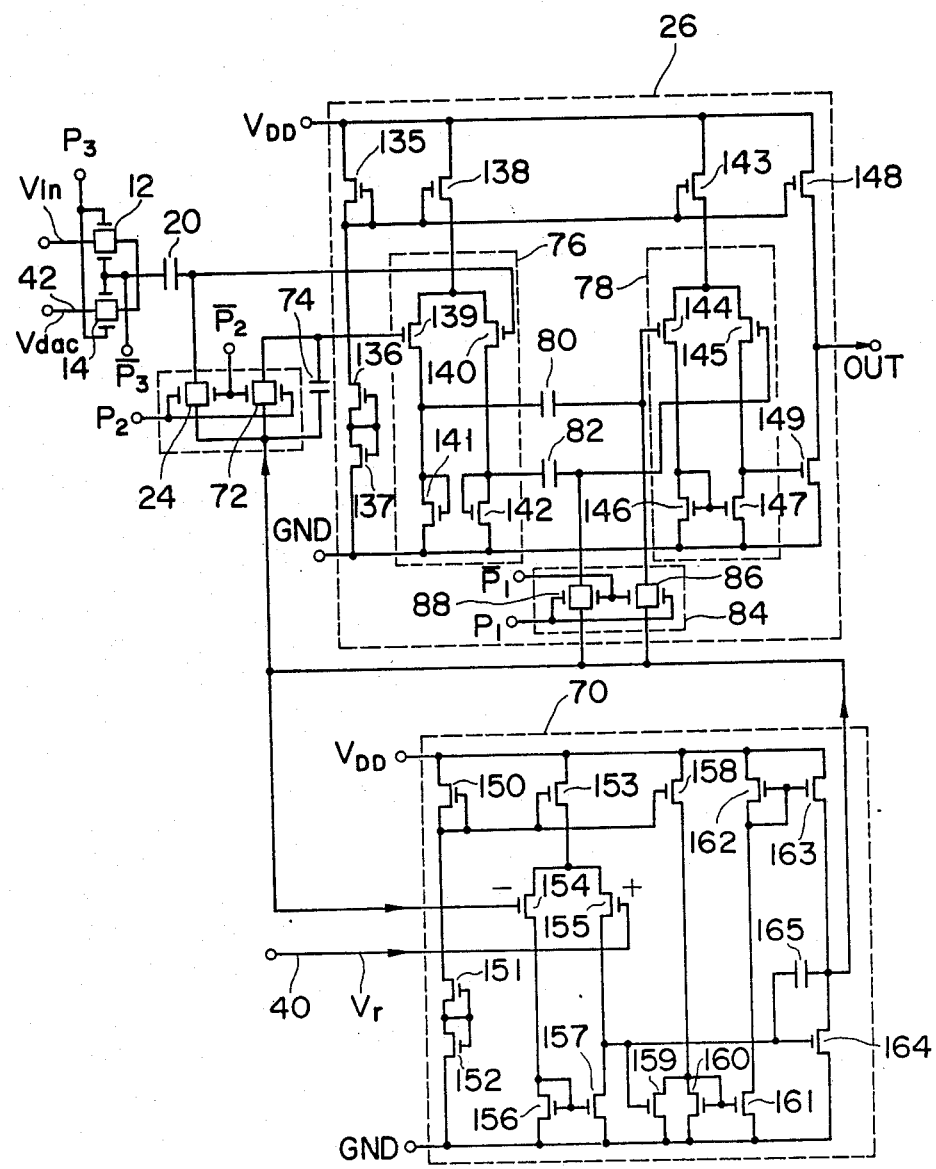
FIG. 7 is a circuit arrangement showing in detail one practical example of circuitry which may be used in the arrangement shown in FIGS. 4 and 5.

FIG. 7 is a circuit arrangement showing in detail one practical example of the differential amplifier 26 and the buffer amplifier 70 shown in FIG. 5. The differential amplifier 26 comprises a plurality of switches: (a) 135, 136, 138, 139, 140, 143, 144, 145 and 148; (b) 137, 141, 142, 146, 147 and 149; and (c) 86 and 88. Each of the group (a) switches is constructed by a P-channel transistor, and each of the group (b) switches by a N-channel transistor, while each of the group (c) switches is formed of two P- and N-channel transistors coupled in parallel. On the other hand, the buffer amplifier 70 comprises a plurality of switches: (a) 150, 151, 153, 154, 155, 158, 162, and 163; and (b) 152, 156, 157, 159, 160, 161 and 164. Each of the group (a) switches is configured by a P-channel transistor, while each of the group (b) switches by a N-channel transistor. The switches 12, 14, 24 and 72 each is formed of two P- and N-channel transistors coupled in parallel.

The detailed operations of the FIG. 7 arrangement is readily appreciated by those skilled in the art, and may be away from the present invention, so that further discussions are omitted for simplicity.

The foregoing description shows only preferred embodiments of the present invention. Various modifications are apparent to those skilled in the art without departing from the scope of the present invention. For example, the d-a converter 20 shown in FIG. 2 is not limited to a 6-bit type. It is apparent that the present invention is found to be more advantageous with a increasing number of the digital signal bits.

What is claimed is:

1. A digital-to-analog converter adapted to convert a digital input signal (N bits) to the analog equivalent, comprising:

($2^U-1$) first resistors where "U" denotes predetermined upper bits of "N", each of which has identical resistance (R), said first resistors being divided into a first group of first resistors that are connected in series at intermediate nodes and form a first separate ladder having at one end a first end node and at the other end a second end node and a second group of first resistors that are connected in series at intermediate nodes and form a second separate ladder having at one end a third end node and at the other end a fourth end node a first reference voltage means and a second reference voltage means, said means being coupled to said first end node and said fourth end node, respectively;

first switch means for selectively deriving one of the voltages appearing at the intermediate nodes of said first resistors;

first switch control means for controlling said first switch means in response to the digital input signal;

$2^L$ second resistors (where $L=N-U$), each of which has a resistance equal to $R/2^L$, which are coupled in series at intermediate connecting nodes and form a third resistor ladder having at one end a fifth end node and at the other end a sixth end node, said first, second and third ladders being coupled by connecting said second end node to said fifth end node and said third end node to said sixth end node;

second switch means for selectively deriving one of the voltages appearing at the intermediate nodes of said second resistors; and second switch control means for controlling said second switch means in response to the digital input signal.

2. A successive approximation analog-to-digital converter adapted to receive an analog input signal for converting same into a (U+L)-bit digital signal (U denotes upper bits and L lower bits), comprising:

a first digital-to-analog converter means having an output that is adapted to be compared with said analog input signal in order to determine the U bits;

a second digital-to-analog converter means having an output that is adapted to be compared with said analog input signal in order to determine the L bits;

a capacitor for storing said analog input signal;

a differential amplifier having first and second input terminals, said first input terminal being coupled to the one end of said capacitor, said second input terminal being coupled to the output of saidd second digital-to-analog converter means;

a successive approximation register for controlling said first and second digital-to-analoig converter means in response to the output of said differential amplifier;

first switch means supplied with said analog input signal and the output signal of said first digital-to-analog converter means, said first switch means being arranged to selectively allow one of the two signals applied thereto to be applied to the other end of said capacitor; and second switch means coupled across said input terminals of said differential amplifier.

3. A successive approximation analog-to-digital converter as claimed in claim 2, wherein said first digital-to-analog converter comprises first and second resistor-ladders each consisting of a plurality of resistors that have the same resistance, and a plurality of third switch means for selecting voltages appearing at nodes of said first and second resistor-ladders, and wherein said second digital-to-analog converter comprises a third resistor-ladder, and a plurality of fourth switch means for selecting voltages appearing at nodes of said third resistor-ladder, said third resistor ladder having a total resistance equal to the resistance of one of the resistors of said first and second resistor-ladders.

4. A successive approximation analog-to-digital converter as claimed in claim 3, wherein each resistor of said third resistor-ladder has a resistance equal to $\frac{1}{2}^L$ of the resistance of one of the resistors of said first and second resistor-ladders.

5. A successive approximation analog-to-digital converter as claimed in claim 3, wherein each of said third switch means is a C-MOS transistor.

6. A successive approximation analog-to-digital converter as claimed in claim 2, further comprising a third switch means coupled between the second input terminal of said differential amplifier and the output of said second digital-to-analog converter, and a second capacitor coupled across said third switch means.

7. A successive approximation analog-to-digital converter as claimed in claim 6, further comprising a buffer amplifier with a gain 1, said buffer amplifier having the input thereof coupled between said third switch means and the output of said second digital to analog converter.

8. A successive approximation analog-to-digital converter as claimed in claim 2, further comprising a buffer amplifier with a gain 1, said buffer amplifier having the input thereof coupled to the output of said second digital-to-analog converter and having the output thereof coupled to the second input terminal of said differential amplifier.

* * * * *